United States Patent
Senoo

(10) Patent No.: US 11,487,614 B2
(45) Date of Patent: Nov. 1, 2022

(54) SEMICONDUCTOR STORING APPARATUS AND READOUT METHOD

(71) Applicant: Winbond Electronics Corp., Taichung (TW)

(72) Inventor: Makoto Senoo, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/191,670

(22) Filed: Mar. 3, 2021

(65) Prior Publication Data
US 2021/0311826 A1    Oct. 7, 2021

(30) Foreign Application Priority Data
Apr. 2, 2020 (JP) ............... JP2020-066573

(51) Int. Cl.
G06F 11/00 (2006.01)
G06F 11/10 (2006.01)
G06F 13/16 (2006.01)
G11C 16/32 (2006.01)
G11C 16/26 (2006.01)
G11C 16/04 (2006.01)

(52) U.S. Cl.
CPC ...... G06F 11/1068 (2013.01); G06F 13/1668 (2013.01); G11C 16/0483 (2013.01); G11C 16/26 (2013.01); G11C 16/32 (2013.01)

(58) Field of Classification Search
CPC . G06F 11/1068; G06F 13/1668; G11C 29/42; G11C 16/0483; G11C 16/26; G11C 16/32
See application file for complete search history.

(56) References Cited

U.S. PATENT DOCUMENTS

| 8,225,047 | B2 | 7/2012 | Yano et al. |
| 8,694,852 | B2* | 4/2014 | Choi ............... G11C 16/349 |
| | | | 714/763 |
| 10,942,675 | B2* | 3/2021 | Yi ................. G06F 3/0604 |

(Continued)

FOREIGN PATENT DOCUMENTS

| CN | 107402837 | 11/2017 |
| JP | 5323170 | 10/2013 |

(Continued)

OTHER PUBLICATIONS

Office Action of Japan Counterpart Application, dated Jun. 16, 2021, pp. 1-3.

(Continued)

Primary Examiner — Esaw T Abraham
(74) Attorney, Agent, or Firm — JCIPRNET

(57) ABSTRACT

A semiconductor storing apparatus capable of shortening a ECC processing time of a readout operation is provided, including a flash memory includes: a memory cell array; a page buffer/sense circuit holding data read out from a selected page of the memory cell array; an error correcting code circuit receiving data from the page buffer/sense circuit and holding error address information of the data; an output circuit selecting data from the page buffer/sense circuit based on a column address, and outputting the selected data to a data bus; and an error correction part correcting data of the data bus based on the error address information.

14 Claims, 10 Drawing Sheets

(56) References Cited

U.S. PATENT DOCUMENTS

| | | | |
|---|---|---|---|
| 2014/0104947 A1 | 4/2014 | Yamauchi et al. | |
| 2016/0034346 A1 | 2/2016 | Michael | |
| 2019/0026181 A1* | 1/2019 | Kim | G11C 29/52 |
| 2019/0325938 A1* | 10/2019 | Lee | G11C 11/4074 |
| 2020/0004453 A1* | 1/2020 | Rori | G06F 3/0608 |
| 2020/0051649 A1* | 2/2020 | Her | G11C 16/3463 |

FOREIGN PATENT DOCUMENTS

| | | |
|---|---|---|
| JP | 2014033364 | 2/2014 |
| JP | 5667143 | 2/2015 |
| JP | 2016035795 | 3/2016 |
| KR | 20140018095 | 2/2014 |
| TW | I497495 | 8/2015 |

OTHER PUBLICATIONS

"Office Action of Korea Counterpart Application", dated May 31, 2022, with English translation thereof, p. 1-p. 10.

\* cited by examiner

Prior Art

Prior Art

SEMICONDUCTOR STORING APPARATUS AND READOUT METHOD

CROSS-REFERENCE TO RELATED APPLICATION

This application claims the priority benefit of Japan application serial no. 2020-066573, filed on Apr. 2, 2020. The entirety of the above-mentioned patent application is hereby incorporated by reference herein and made a part of this specification.

BACKGROUND

Field of the Disclosure

The invention relates to a semiconductor storing apparatus such as a NAND flash memory, and more particularly relates to error detection/correction during a read operation.

Description of Related Art

Some NAND flash memories equipped with serial peripheral interface (SPI) that input/output data in synchronization with an external clock signal have the function of continuously reading pages. During continuous reading of the page, while the data read out from the selected page of the memory cell array is held in one of the latches of the page buffer/sense circuit, the read data held in the previous page of another latch circuit can be output, for example, as described in Patent Reference 1 (Japanese Laid-Open No. 5323170), Patent Reference 2 (Japanese Laid-Open No. 5667143), Patent Reference 3 (US Patent Application US2014/0104947A1).

SUMMARY

In NAND flash memory, as data is written or erased repeatedly, the charge retention characteristics are deteriorated due to deterioration of the tunnel insulating film, etc., or the threshold value changes due to the charge trapped by the tunnel insulating film, which causes bit errors. As a countermeasure against such bit errors, an error correcting code (ECC) circuit is provided.

FIG. 1 shows the schematic structure of a conventional NAND flash memory equipped with an on-chip ECC function. The flash memory 10 includes a memory cell array 20, a page buffer/sense circuit 30, an error correcting code circuit (hereinafter referred to as an ECC circuit) 40, and an input/output circuit 50. The ECC circuit 40 includes a transmission circuit 42, an ECC core 44, an error register 46 and a write circuit 48.

In the read operation, the data read out from a selected page of the memory cell array 20 is held in the page buffer/sense circuit 30, and the data in units of bytes held in the page buffer/sense circuit 30 is transmitted to the ECC core 44 through the transmission circuit 42. The ECC core 44 performs an ECC operation on the transmitted data, and holds the error information obtained by the operation in the error register 46. The write circuit 48 writes the corrected data back to the page buffer/sense circuit 30 based on the error information held in the error register 46. After the ECC processing of a page is completed, the data held in the page buffer/sense circuit 30 is read out to the data bus 60 according to the column address, and the read data is provided to the external input/output circuit 50. The input/output circuit 50 outputs the read data from an input/output terminal that is not shown.

FIG. 2A and FIG. 2B show time charts of a duration in which continuous read operation of pages is performed. The page buffer/sense circuit 30 includes two latches L1 and L2 (one latch holds, for example, 2 KB of page data), the latches L1 and L2 each include a first cache memory (cache) C0 and the second cache memory C1 (a cache memory is, for example, 1 KB). The data held by the first cache memory C0 and the second cache memory C1 of the latch L1 are independently transmitted respectively to the first cache memory C0 and the second cache memory C1 of the latch L2.

In the beginning, the array read operation is performed on the page 0, and the data of page 0 is held in the first cache memory C0 and the second cache memory C1 (P0C0, P0C1) of the latch L1. Next, the data of the first cache memory C0 and the second cache memory C1 of the latch L1 are transmitted to the first cache memory C0 and the second cache memory C1 of the latch L2, and the ECC core 42 performs ECC processing on the data in the first cache memory C0 and the second cache memory C1. If an error is detected, the write circuit 48 writes the corrected data to the first cache memory C0 and the second cache memory C1 of the latch L2 according to the error information held in the error register 46.

In continuous read operation, the row address counter is automatically incremented, reads out the next page 1, and transmits the read data to the first cache memory C0 and the second cache memory C1 of the latch L1. During this period, the data in the first cache memory C0 of the latch L2 is transmitted to the input/output circuit 50, and the data held by the input/output circuit 50 is output in synchronization with the external clock signal ExCLK supplied externally. Thereafter, from the input/output circuit 50, the data in the second cache memory C1 of the latch L2 is output in synchronization with the external clock signal ExCLK, and during this period, the data in the first cache memory C0 of the latch L1 is transmitted to the latch L2, and the ECC circuit 40 performs ECC processing.

The data in the second cache memory C1 of the latch L1 is transmitted to the latch L2, and while the data in the first cache memory C0 of the latch L2 is output from the input/output circuit 50, ECC processing is performed on the data in the second cache memory C1 of the second latch L2. Then, while the data in the second cache memory C1 of the latch L2 is output from the input/output circuit 50, the next page 2 is read out from the array, and transmitted to the first cache memory C0 and the second cache memory C1 of the latch L1, and the data in the first cache memory C0 is transmitted to the latch L2 for ECC processing.

While outputting data from the latch L2, the pages of the memory cell array are read continuously. During this period, the ECC processing is performed on the second cache memory C1 while the data in the first cache memory C0 is output. The ECC processing is performed on the first cache memory C0 while the data in the second cache memory C1 is output.

The read operation of the memory cell array is performed in synchronization with the internal clock signal according to the determined timing. On the other hand, the output of the read data is performed in synchronization with the external clock signal ExCLK which is not synchronized with the internal clock signal. Therefore, in the continuous read operation of the page, there is a limitation shown in the following equation (1).

$$tPRE+tDIS+tECC<tDOUT \quad (1)$$

tPRE: Precharge time of the bit line,
tDIS: the discharge time of the memory cell
tECC: ECC processing time for ½ page
tDOUT: the data output time of a page.

tPRE and tDIS are fixed. If the frequency of the external clock signal ExCLK is increased for high-speed read operation, tDOUT becomes smaller. Accordingly, tECC must be reduced. For example, when reading 2 KB page data, tPRE+tDIS is about 16.2 µs. The frequency of the external clock signal ExCLK is 166 MHz. When the data of one page is output from the ×4 external terminal, tDOUT is about 24.6 µs. According to equation (1), ECC processing time has the limitation of equation (2).

$$tECC<8.4\ \mu s \quad (2)$$

When the ECC circuit performs 1-bit error detection/correction, Hamming code can be adopted under the circumstances, and its processing time is relatively short, so there is a margin in the frequency of the external clock signal ExCLK. On the other hand, in the case of multi-bit error detection/correction, Bose-Chaudhuri-Hocquenghem (BCH) code is required. In the processing of BCH code, the processing time is longer than the processing time of Hamming codes. Under the circumstances, the ECC processing time (tECC) of equation (2) may be a bottleneck.

FIG. 3 illustrates a conventional flow for decoding a BCH code. As an example, one page (2 KB) includes two cache memories C0 and C1, and one cache memory includes two sectors. ECC is performed in units of sectors (for example, 512 bytes). A cache memory requires two times of ECC processing. Through the BCH code, four-bit error detection/correction for each cache memory can be realized. Furthermore, the ECC processing is performed in synchronization with the ECC clock signal, and the clock frequency is set to 50 MHz.

Step 1: The syndrome of the data read from the first sector and the second sector is evaluated. This step includes the following processing, that is, accessing the page buffer/sense circuit 30 through the transmission circuit 42 and reading data therefrom, and 140 clock cycles are required for each sector.

Step 2: After the evaluation of the syndrome of the first sector, the error location polynomial (ELP) of the first sector is calculated. After the evaluation of the syndrome of the second sector, the second error location polynomial (ELP) of the second sector is calculated. The calculations require 81 clock cycles respectively.

Step 3: The root of the ELP of the first sector is calculated, and its error location is determined. The root of the ELP of the second sector is calculated, and its error location is determined. These calculations require 135 clock cycles respectively.

Step 4: Based on the error location, the corrected data is written back to the page buffer/sense circuit. This processing requires 20 clock cycles.

As long as the same step is not repeated, the processing on the first sector and the second sector in steps 1 to 4 can be performed in parallel. The ECC processing on a cache memory requires 516 clock cycles. If the clock cycles are converted into time, tECC=10.32 µs.

In the case of using Hamming code, the steps 2 and 3 in the case of using the BCH code are not required, and a total of 288 clock cycles (ECC=5.8 µs) are required. Therefore, if Hamming code is adopted, the limitation of tECC<8.4 µs shown in the equation (2) can be satisfied. However, in the case that the BCH code is adopted, then tECC(=10.32)>8.4 µs, which cannot satisfy the limitation of tECC<8.4 µs. That is, the maximum frequency of the external clock signal ExCLK at tECC=10.32 µs is 154.4 MHz, and it is not possible to perform high-speed reading which adopts the 166 MHz external clock signal ExCLK. The rectangular region illustrated as the shaded region shown in FIG. 2B represents a state where tECC=10.32 µs does not satisfy the limitation.

When continuous read operation is performed in the conventional flash memory, there is a problem: If the ECC processing time is long, the frequency of the external clock signal ExCLK is limited, and high-speed reading cannot be performed.

A purpose of the invention is to solve the conventional problem and provide a semiconductor storing apparatus and a readout method capable of reducing the ECC processing time during a read operation.

The semiconductor storing apparatus of the invention includes a memory cell array; a page buffer/sense circuit holding data read out from a selected page of the memory cell array; an ECC circuit receiving data that is held in the page buffer/sense circuit and detecting the data, and holding error address information related to the error address that is detected; an output circuit selecting data from the page buffer/sense circuit based on a column address, and outputting the selected data to a data bus; and an error correction part correcting data on the data bus based on the error address information.

The readout method of the flash memory of the invention includes the following steps: during the read operation, receiving data held in the page buffer/sense circuit, detecting the data; holding the error address information related to the error address that is detected; selecting data from the page buffer/sense circuit based on the column address, and outputting the selected data to the data bus; correcting the data on the data bus based on the error address information; and outputting the corrected data to the outside.

According to the invention, the data on the data bus output from the page buffer/sense circuit is corrected based on the error address information. Therefore, compared with conventional technology, the time required for error detection/correction can be shortened. In this manner, the time for read operation can be reduced. Furthermore, when performing continuous reading of pages, the reading speed can be increased compared to conventional technology.

DETAILED DESCRIPTION OF DISCLOSED EMBODIMENTS

Next, embodiments of the invention will be described in detail with reference to the drawings. The semiconductor storing apparatus of the invention is, for example, a NAND flash memory, or a microprocessor, a microcontroller, logic, or an application specific integrated circuit (ASIC) embedded with such flash memory, a processor that processes images or sounds, a processor that processes signals such as wireless signals, etc.

Figure 4:
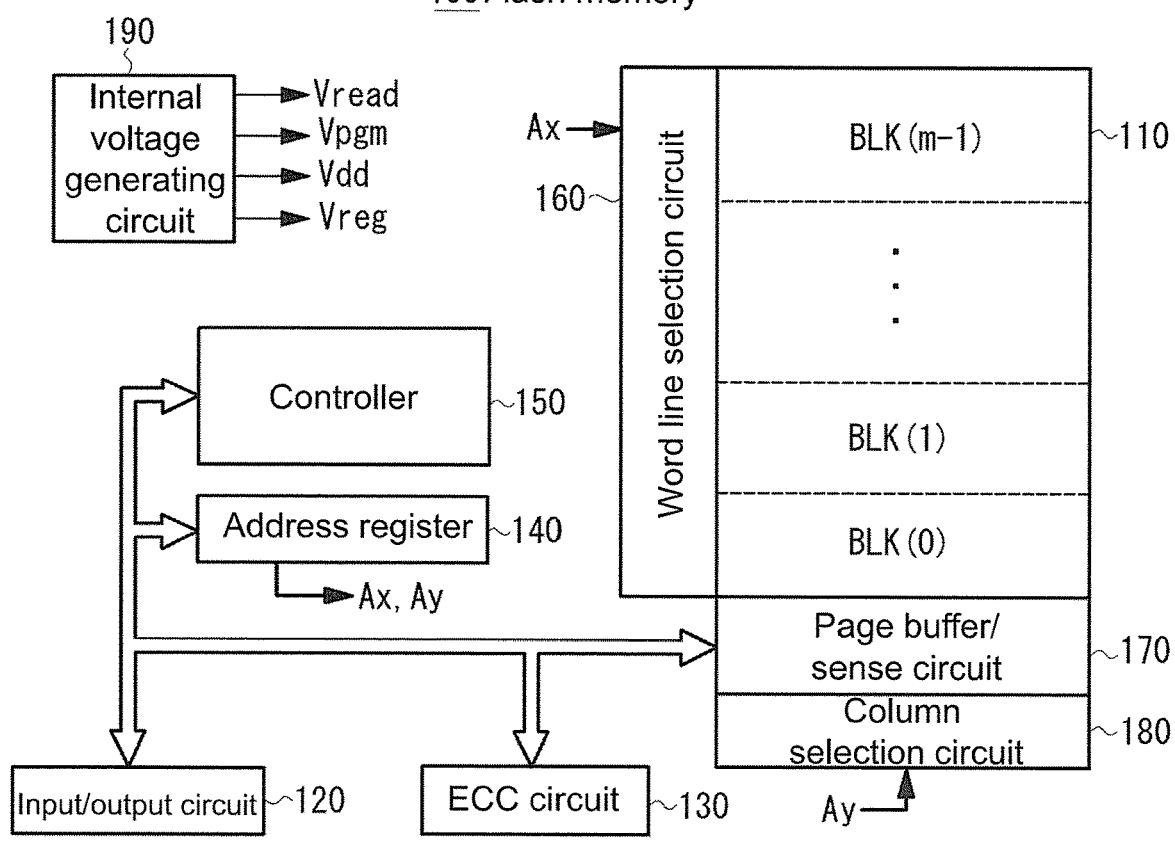
FIG. 4 is a block diagram showing the structure of a NAND flash memory according to an embodiment of the invention.

FIG. 4 is a block diagram showing the structure of a NAND flash memory according to an embodiment of the invention. The flash memory 100 of this embodiment is composed of the following parts: the memory array 110 is arranged in a matrix with a plurality of memory cells; the input/output circuit 120 can input/output data corresponding to SPI; the error correcting code (ECC) circuit 130 for performing error detection/correction operation on data to be written or read; the address register 140 which receives address data through the input/output circuit 120; the controller 150 which controls various parts based on the command data received through the input/output circuit 120 or the control signal applied to the control terminal; the word line selection circuit 160 which receives the row address information Ax from the address register 140, and selects blocks or word lines based on the decoding result of the row address information Ax; the page buffer/sense circuit 170 which holds the data read from the page selected by the word line selection circuit 160, or holds the data written to the selected page; the column selection circuit 180 which selects the columns in the page buffer/sense circuit 170 based on the decoding result of the column address information Ay from the address register 140; and the internal voltage generating circuit 190 which generates various voltages required for reading, writing and erasing data (write voltage Vpgm, pass voltage Vpass, read pass voltage Vread, erase voltage Vers, etc.).

The memory cell array 110 includes m blocks BLK(0), BLK(1), ..., BLK(m-1). In one block, multiple NAND strings are formed. The memory cell array 110 may be formed two-dimensionally on the surface of the substrate, or formed three-dimensionally in a vertical direction from the surface of the substrate. Moreover, the memory cell can be either a single-level cell (SLC) type that stores 1 bit (binary data), or a multi-level cell (MLC) type that stores multiple bits.

The ECC circuit 130 can be set to operate or not to operate by commands or settings at the time of shipment. The ECC circuit 130 performs error detection/correction operation on the data read from the memory cell array 110, or generates the code for the data to be written to the memory cell array 110. The ECC circuit 130 can perform error detection/correction in single bit, as well as error detection/correction in multibit. The ECC circuit 130 will be described in details below.

The controller 150 includes a state machine or a microcontroller, which controls various actions of the flash memory. In the read operation, a certain positive voltage is applied to the bit line, a certain voltage (for example, 0V) is applied to the selected word line, and a pass voltage is applied to the non-selected word line, so that the bit line side selection transistor and the source line side selection transistor is turned on and 0V of voltage is applied to the source line. In the write operation, a high-voltage write voltage Vpgm is applied to the selected word line, an intermediate potential is applied to the non-selected word line, so that the bit line side selection transistor is turned on, and the source line side selection transistor is turned off. A potential corresponding to the data "0" or "1" is supplied to the bit line. In the erase operation, 0V of voltage is applied to all selected word lines in a block, a high-voltage erase voltage is applied to the P-well, and electrons from the floating gate are extracted to the substrate, and data is erased in units of blocks.

Figure 2A:
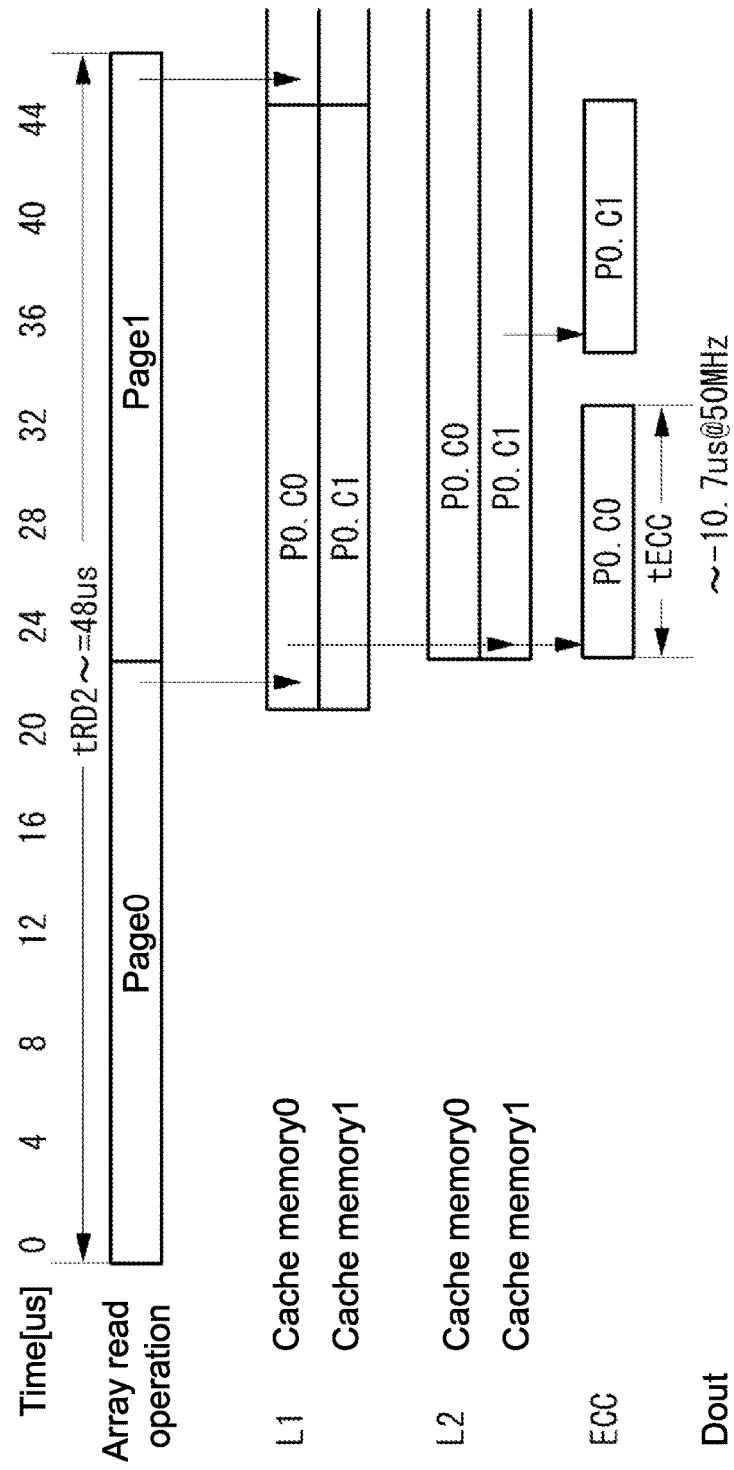
FIG. 2A is a time chart when continuous read operation is performed in a conventional NAND flash memory.
Figure 2B:
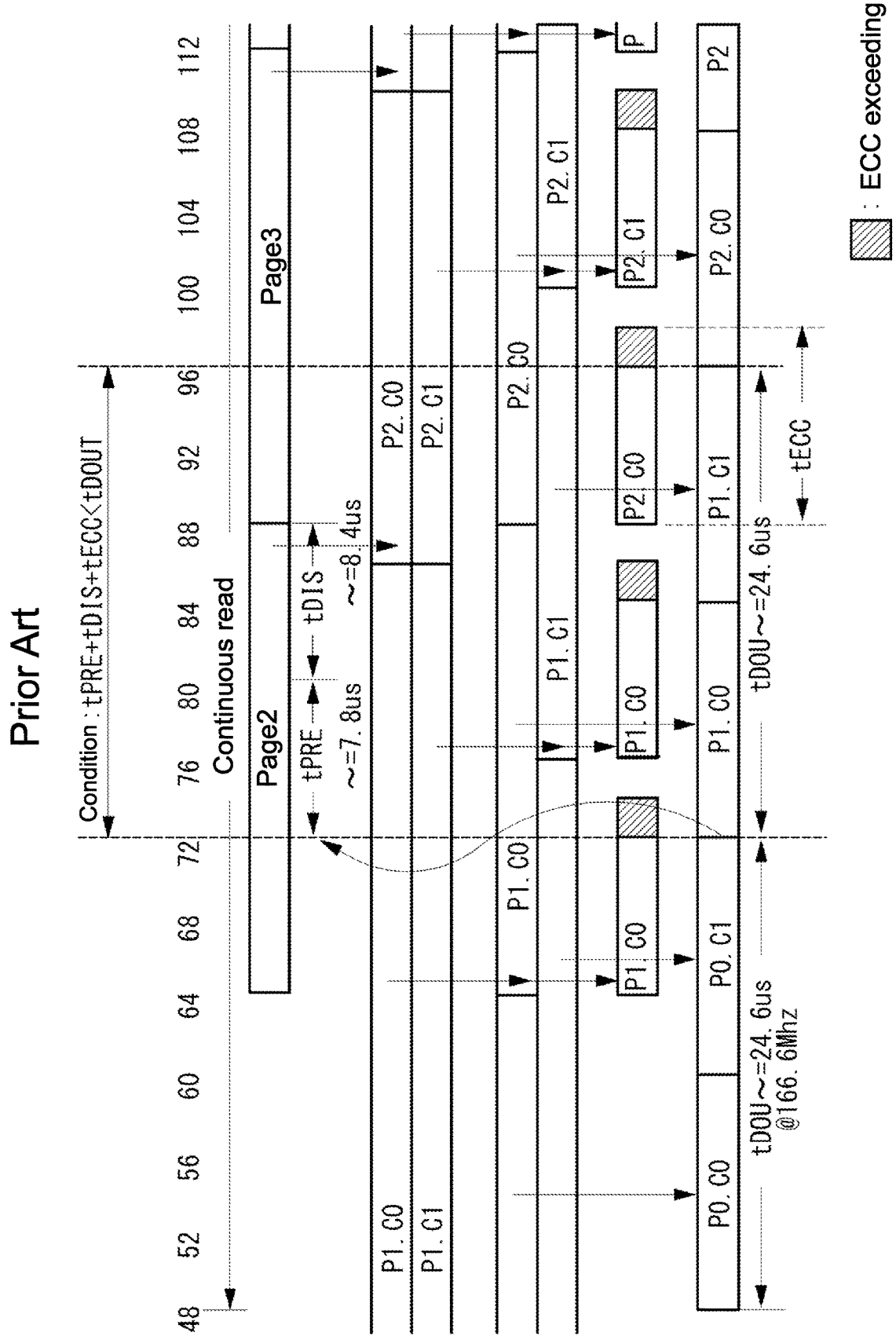
FIG. 2B is a time chart when continuous read operation is performed in a conventional NAND flash memory.

As shown in FIG. 2A and FIG. 2B, the page buffer/sense circuit 170 includes two latches L1 and L2. The latch L1 and the latch L2 are respectively formed by including the first cache memory C0 and the second cache memory C1 that can operate independently. A transmission gate capable of bidirectional data transmission is connected between the latch L1 and the latch L2. By turning on the transmission gate, the data is transmitted from the latch L1 to the latch L2 or from the latch L2 to the latch L1.

The data read from the selected page of the memory cell array is read at the read node, and the read data is transmitted to the latch L1 and held therein. When the page is continuously read, the read operation of the memory cell array and the data transmission between the latch L1 and the latch L2 are performed in synchronization with the internal clock signal, the data transmission between the latch L2 and the input/output circuit 120 as well as the data output from the input/output circuit 120 are performed in synchronization with the external clock signal ExCLK supplied externally. The data transmission between the latch L2 and the ECC circuit 130 and the operation of the ECC circuit are performed in synchronization with another internal clock signal or the clock obtained by dividing the frequency of an external clock signal ExCLK supplied externally.

The column selection circuit 180 selects the reading start address of the data in the selected page based on the column address Ay, or automatically reads the data from the top address of the page without using the column address. Furthermore, the column selection circuit 180 may also include a column address counter, which increments the column address in response to the clock signal.

Figure 5:
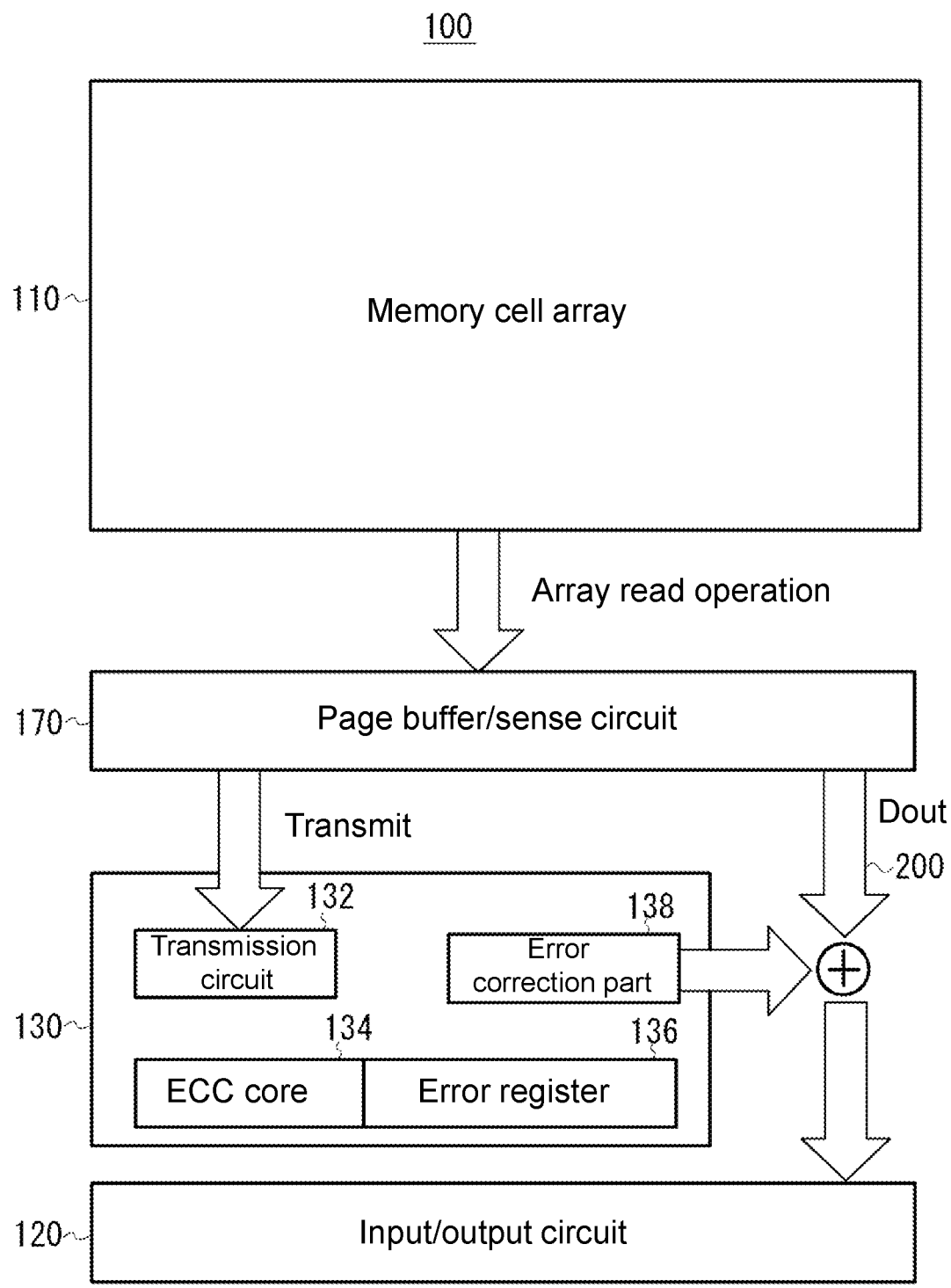
FIG. 5 is a schematic diagram showing a configuration of an ECC circuit according to the first embodiment of the invention.

FIG. 5 shows the structure of the ECC circuit 130 of this embodiment. The ECC circuit 130 includes: a transmission circuit 132 for reading the data held by the page buffer/sense circuit 170; the ECC core 134 for processing the data read by the transmission circuit 132 to detect errors; the error register 136 for holding the error address information of the error detected by the ECC core 134; and the error correction part 138 for correcting the data output to the data bus 200 based on the error address information held by the error register 136. The error address information held by the error register 136 is information capable for identifying the column address and bit address of the error.

Unlike in the past, the ECC circuit 130 of this embodiment does not access the page buffer/sense circuit, and writes corrected data into the page buffer/sense circuit 170 through the write circuit for performing correction. Instead, the ECC circuit 130 of this embodiment does not access the page buffer/sense circuit, but performs correction by inverting the data output from the page buffer/sense circuit 170 to the data bus 200.

Figure 6:
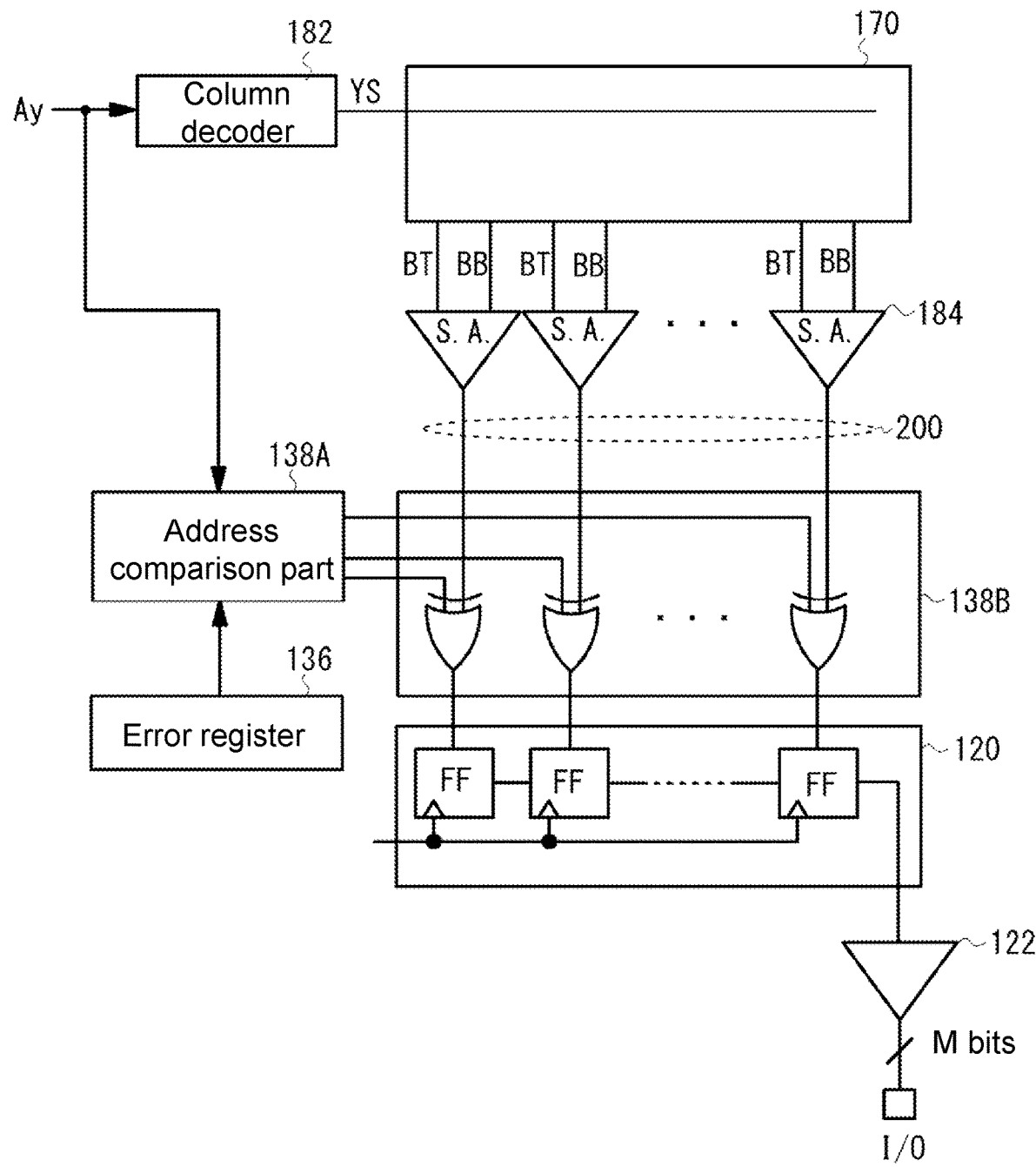
FIG. 6 is a detailed diagram illustrating the error correction part of the ECC circuit according to the first embodiment of the invention.

FIG. 6 shows a configuration example of the error correction part 138. The error correction part 138 includes: an address comparison part 138A which compares the column address Ay with the error address information held by the error register 136; and the inversion circuit 138B which has the following function: inverting the data on the data bus 200 based on the inversion control signal output from the address comparison part 138A.

When the data held by the page buffer/sense circuit 170 is output, an n bit data is selected from the data in the page held by the page buffer/sense circuit 170 based on the column selection signal YS obtained by decoding the column address Ay. The column selection signal YS is generated by the column decoder 182 of the column selection circuit 180. The n bit data selected from the page buffer/sense circuit 170 is input as differential data to the bit line pair BT/BB of the n differential sense amplifiers 184, and the differential sense amplifier 184 senses the differential data of bit line pair BT/BB. The n bit data sensed by the differential sense amplifier 184 are respectively input to one of the n exclusive or gate (ExOR) circuits corresponding to the inversion circuit 138B. For the other input of ExOR, the inversion control signal from the address comparison part 138A is input respectively.

The address comparison part 138A compares the error address information of the error register 136 with the column address Ay when data is output from the page buffer/sense circuit 170. If the two addresses are consistent, an H-level inversion control signal is output to the bit (ExOR) corresponding to the error bit address of the error register 136, and an L-level inversion control signal is output to the bit (ExOR) not corresponding to the error bit address. Moreover, if the two addresses are inconsistent, the L-level inversion control signal is output to all the bits (ExOR). If there is an error in the data read from the page buffer/sense circuit 170, the inversion circuit 138B is utilized to inverse and correct the error. If the read data is error-free, the inversion circuit 138B is not used for inversion and the data is output directly.

The n bit data output from the ExOR of the inversion circuit 138B is supplied to the input/output circuit 120. The input/output circuit 120 includes a parallel/serial conversion circuit connected with a plurality of flip flops, and the parallel/serial conversion circuit converts the input n bit data into m serial data. The converted serial data is output to the outside from the m-bit input/output terminal I/O through the driver 122.

In the continuous reading of the page, an external clock signal ExCLK is supplied to the clock terminal, and the external clock signal ExCLK is supplied to a timing control circuit that is not shown. The timing control circuit generates an internal clock signal synchronized with the external clock signal ExCLK, and the internal clock signal is supplied to the input/output circuit 120 or the differential sense amplifier 184 or the like.

The number of bits n selected by the column decoder 182 at a time is equal to the bit width of the data bus 200, that is, the number of bit line pairs BT/BB. The number of I/O terminals is arbitrary, but when the number of I/O terminals is m bits, m≤n, and n is in a relationship of k times m (m and k are each an integer of 1 or more).

Figure 7:
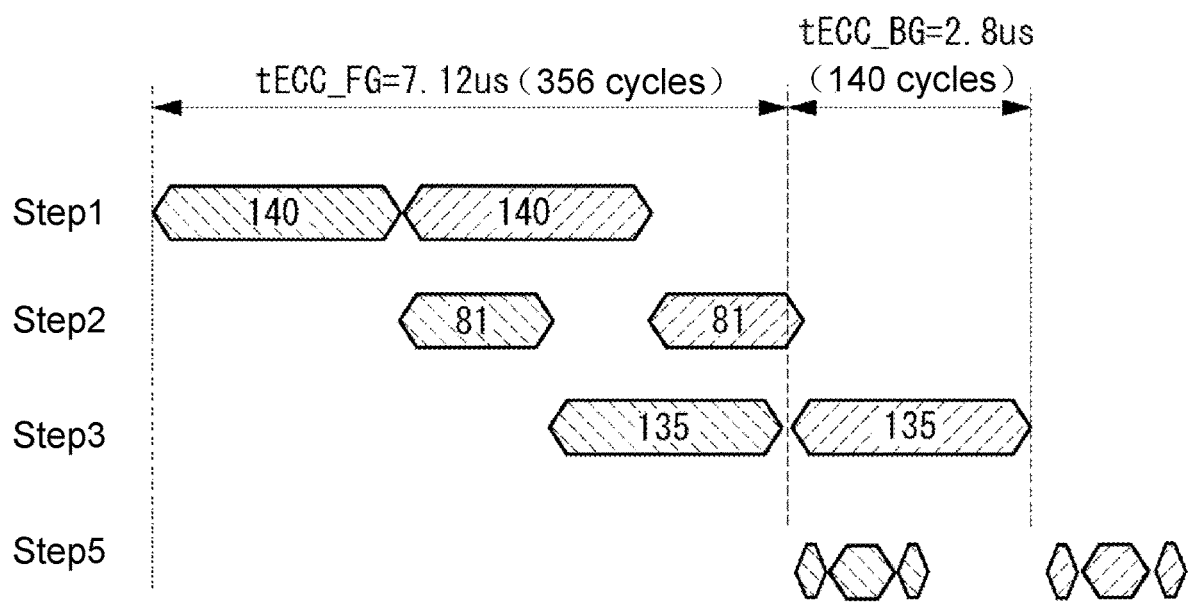
FIG. 7 is a diagram exemplifying a BCH decoding flow performed by an ECC circuit according to the first embodiment of the invention.

FIG. 7 is a diagram exemplifying a BCH decoding flow performed by the ECC circuit 130 according to the embodiment. This process corresponds to the conventional decoding flow for BCH code shown in FIG. 3. The ECC circuit 130 uses a 50 MHz clock signal to perform ECC processing. A cache memory includes a first sector and a second sector. Steps 1 to 3 are the same as the steps in the flow shown in FIG. 3, but in this embodiment, step 4 is not performed and step 5 is implemented.

Step 5: The data output from the page buffer/sense circuit 170 to the data bus 200 is inverted, thereby implementing error correction.

In this embodiment, the write back operation on the page buffer/sense circuit in step 4 is not performed. That is, the page buffer/sense circuit 170 is not accessed. Therefore, the ECC circuit 130 can perform processing in step 3 up to the processing on the root of the ELP in the first sector at the foreground, and perform processing on the root of the ELP in the second sector at the background during the error correction period of the first sector. After the page buffer/sense circuit 170 is accessed in step 1, no write operation is performed on the page buffer/sense circuit 170, so the operation of reading data from the page buffer/sense circuit will not be in conflict with the accessing operation performed by the ECC circuit. Furthermore, as long as the error address of the first sector is determined in step 3, the error address information can be used to immediately correct the data on the data bus. Therefore, the operations in step 3 are performed up to the calculation of the error address of the first sector at the foreground. Thereafter, the data of the first sector is output from the page buffer/sense circuit 170 to the data bus 200. During the error correction period, the calculation of the error address of the second sector in step 3 is processed at the background.

The processing time tECC_FG for the ECC circuit 130 at the foreground requires 356 clock cycles, which is tECC_FG=7.12 µs, and the processing time tECC_BG at the background requires 140 clock cycles, which is tECC_BG=2.8 µs. tECC_FG=7.12 µs satisfies the limitation of tECC<8.4 µs shown in equation (2). When tEC_FG=7.12 µs, it is tPRE+tDIS+tECC_FG=23.32 µs. If it is converted to the frequency of the external clock signal ExCLK, the frequency of the external clock signal ExCLK can be accelerated to 175.6 MHz. In other words, it is possible to perform multi-bit ECC processing by using the 175.6 MHz external clock signal ExCLK while performing continuous page reading.

Figure 8:
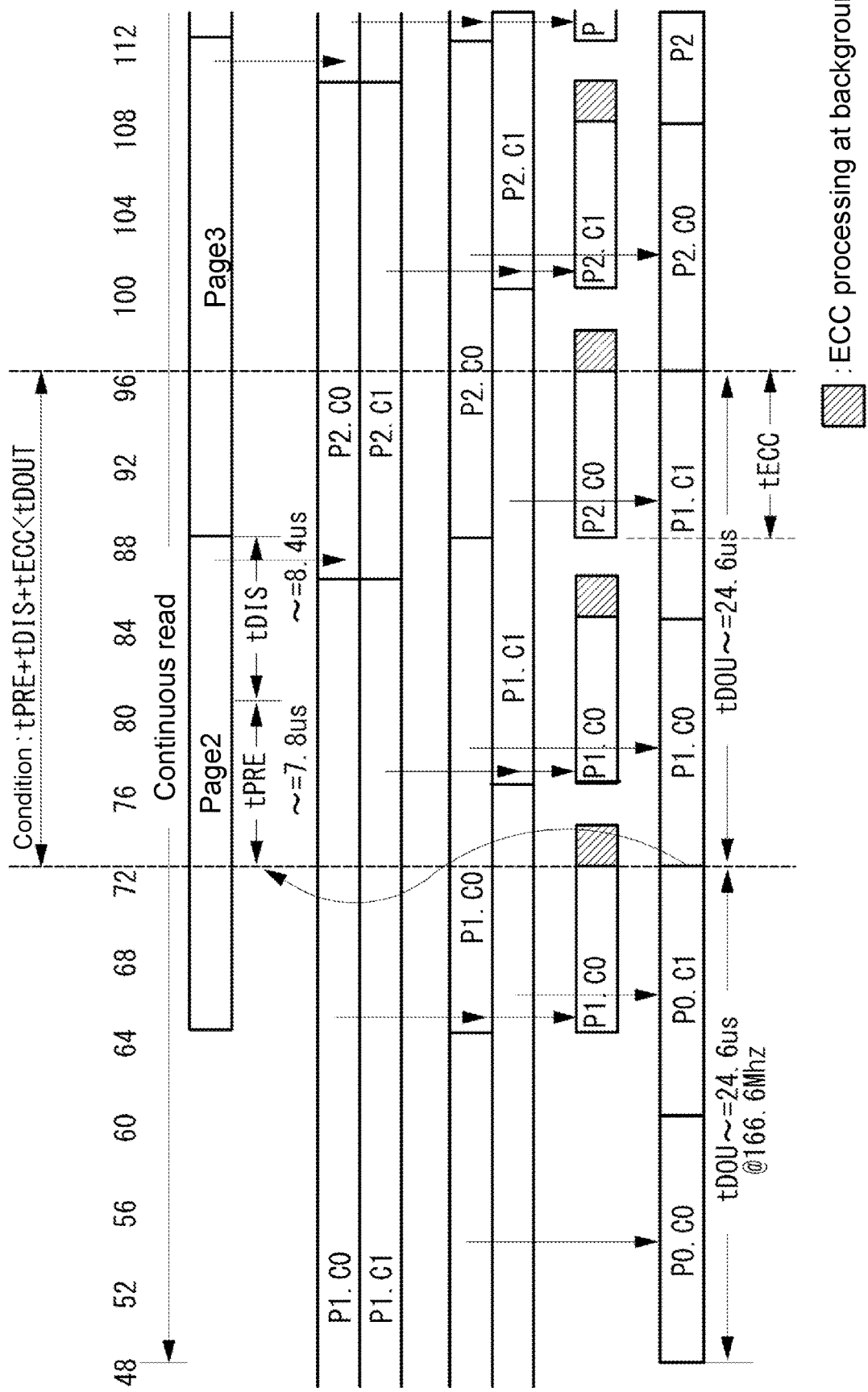
FIG. 8 is a time chart showing a duration in which a continuous read operation is performed according to the first embodiment of the invention.

FIG. 8 is a time chart showing a duration in which a continuous read operation is performed according to the embodiment. When the controller 150 receives a command of continuous read operation through the input/output circuit 120, the controller 150 controls the continuous read operation of multiple pages from the start address, and when the command of terminating continuous read operation is received, the controller 150 terminates the continuous read operation at the end address. In the continuous read operation, while the data is output from one of the latches L2 of the page buffer/sense circuit 170, the data read from the selected page of the memory cell array is transmitted to the other latch L1. The data transmission from the latch L1 to the latch L2 is carried out by using the first cache memory C0 or the second cache memory C1. When the data in one of the cache memories of the latch L2 is transmitted to the input/output circuit 120, the ECC circuit 130 is used to process data in the other cache memory of the latch L2. The data transmitted to the input/output circuit 120 is output from the external input/output terminal in synchronization with the external clock signal ExCLK.

As shown in this figure, tDOUT is 24.6 μs when the external clock signal ExCLK is 166 MHz, and the read time (tPRE+tDIS+tECC) of this embodiment is less than tDOUT. The rectangular region illustrated as a shaded region in the figure represents the processing performed by the ECC circuit 130 at the background (processing on the ELP of the second sector, etc.).

According to this embodiment, the data output from the page buffer/sense circuit 170 to the data bus 200 is corrected. Therefore, for error correction, there is no need to access the page buffer/sense circuit. It is possible to execute a part of the processing of the ECC circuit at the background as a result, and the processing time for the ECC circuit can be shortened. As a result, the speed of continuous reading can be increased. The above embodiment shows an example in which the ECC circuit 130 is adapted in the continuous read operation, but the invention is not limited thereto. Certainly, the ECC circuit 130 can also be adapted in normal page read operation.

Figure 9:
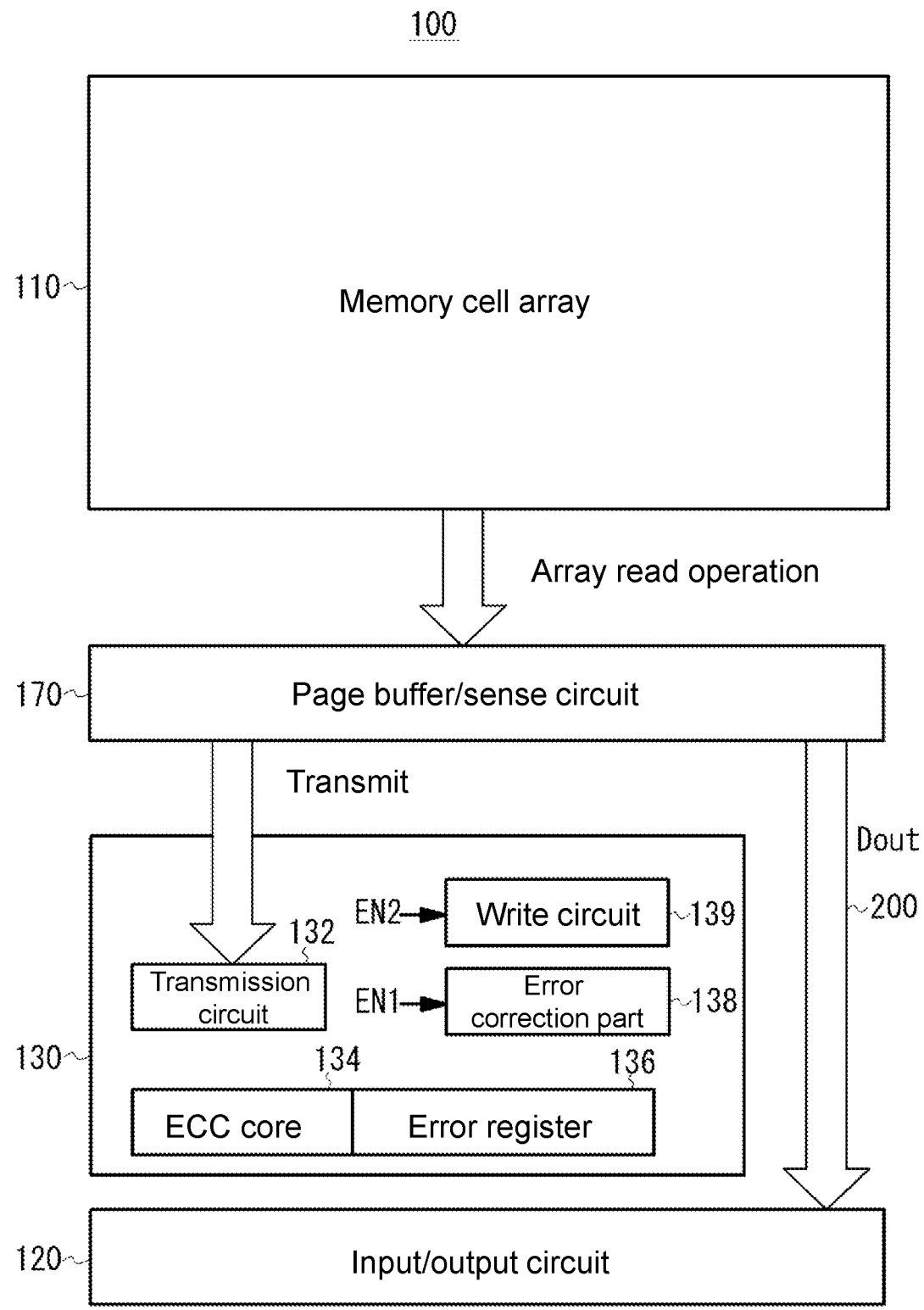
FIG. 9 is a diagram illustrating an error detection/correction method according to the second embodiment of the invention.

Next, a second embodiment of the invention will be described. FIG. 9 is a diagram showing the ECC circuit of the flash memory in the second embodiment. As shown in this figure, the ECC circuit 130 further includes a write circuit 139 in addition to the structure described in the first embodiment. The controller 150 identifies page read or continuous read based on the read command that is input. Based on the identification result, it is possible for the error correction part 138 or the write circuit 139 to selectively operate through the enable signal EN1 and the enable signal EN2.

Figure 10:
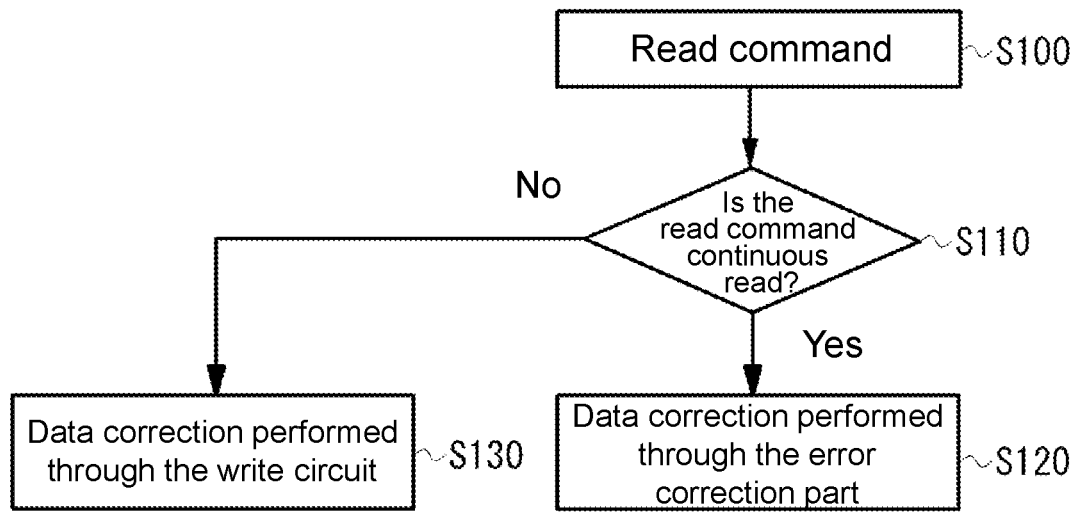
FIG. 10 is an action flow of the error detection/correction method according to the second embodiment of the invention.

FIG. 10 is an operation flow of the ECC circuit of the second embodiment. When the controller 150 receives the read command (S100), the controller 150 identifies whether the command is continuous read or page read (S110). In the case of continuous read, the controller 150 enables the error correction part 138 through the enable signal EN1, and disables the write circuit 139 through the enable signal EN2. Accordingly, as in the first embodiment, the error correction part 138 corrects the data output from the page buffer/sense circuit 170 to the data bus 200 (S120).

Figure 1:
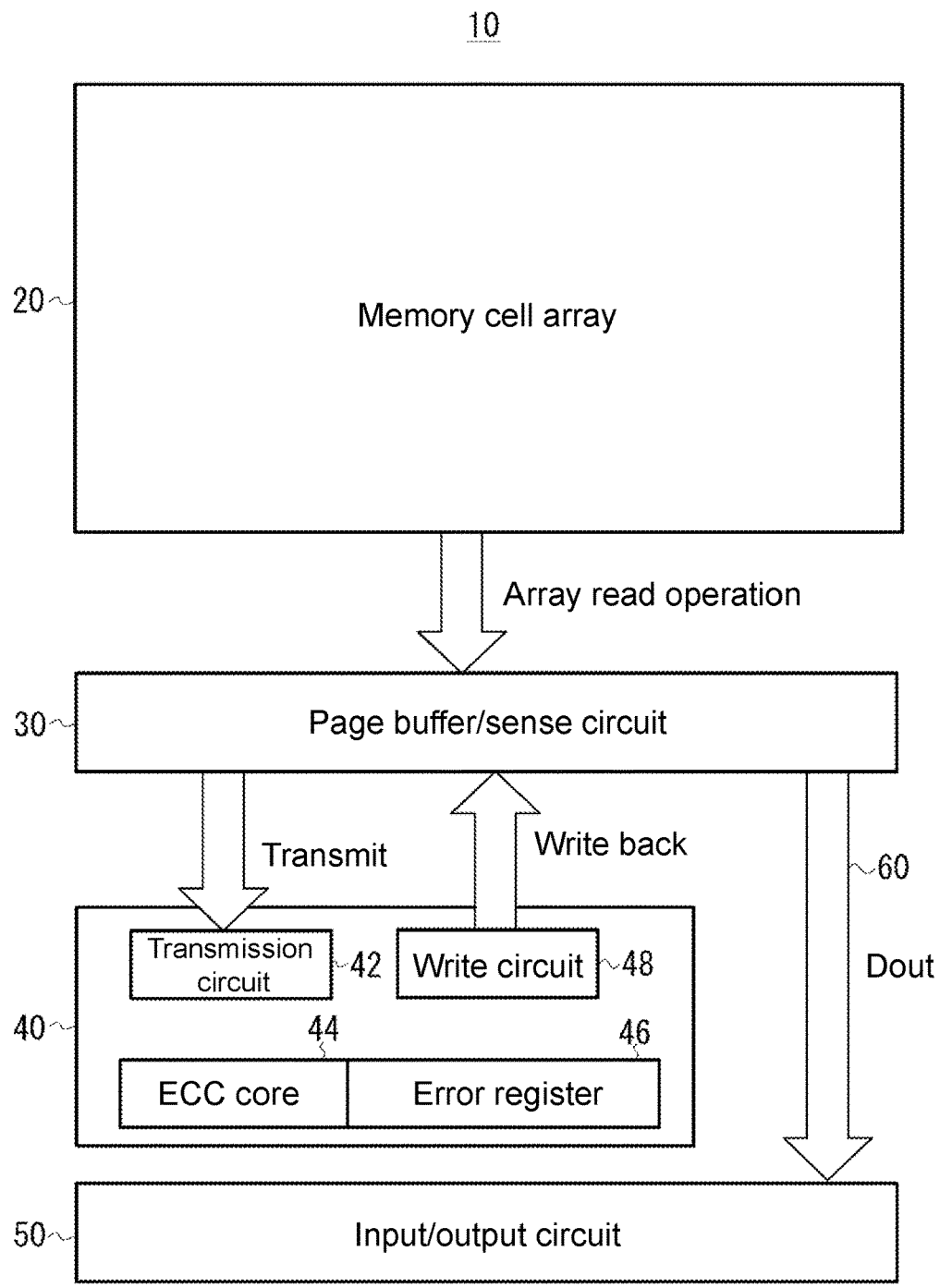
FIG. 1 is a schematic diagram showing a structure of a conventional NAND flash memory with on-chip ECC.

On the other hand, if the command is page read, the controller 150 disables the error correction part 138 through the enable signal EN1, and enables the write circuit 139 through the enable signal EN2. When the error correction part 138 is disabled, all the inversion control signals are set to L level, so that the data on the data bus 200 can pass directly. On the other hand, as shown in FIG. 1, the write circuit 139 writes the corrected data back to the page buffer/sense circuit 170 based on the error address information (S130).

According to the embodiment, if the command is continuous read, the ECC processing that emphasizes reading speed is performed, and if the command is page read, utilization of IDM (Internal Date Move) function and data reliability can be improved. IDM is the function of copying the data in the page of the page buffer/sense circuit to the pages of other blocks. After performing ECC processing on the data held by the page buffer/sense circuit, the data is written back to the page buffer/sense circuit, and the data in the page subjected to the ECC processing is written to the page of other blocks. That is, the page buffer/sense circuit must hold the data corrected by the ECC circuit.

Figure 3:
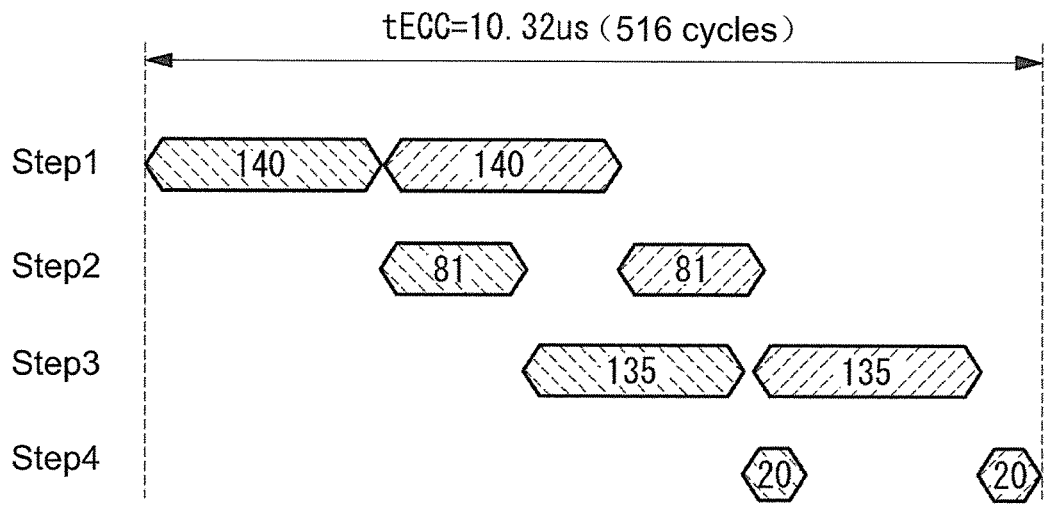
FIG. 3 is a diagram exemplifying a BCH decoding flow performed by a conventional ECC circuit.

In the embodiment, the flow of decoding the BCH code performed by the multi-bit ECC is shown in FIG. 3 and FIG. 7, but these flows (algorithms) are examples, and other flows can also be adopted to decode the BCH code. Furthermore, the invention is not limited to multi-bit ECC, and can also be applied to an ECC circuit that performs 1-bit error detection/correction or error detection/correction by using codes other than BCH code.

The preferred embodiments of the invention have been described in detail, but the invention is not limited to specific embodiments, and various modifications and changes can be made within the scope of the gist of the invention described in the claims.

What is claimed is:

1. A semiconductor storing apparatus, comprising:
a memory cell array;
a page buffer/sense circuit, holding data read from a selected page of the memory cell array;
an error correcting code (ECC) circuit, receiving the data that is held in the page buffer/sense circuit and detecting the data, and holding error address information related to an error address that is detected;
an output circuit, selecting the data from the page buffer/sense circuit based on a column address, and outputting the selected data to a data bus; and
an error correction part, correcting the data on the data bus based on the error address information.

2. The semiconductor storing apparatus according to claim 1, wherein
the error correction part comprises an inversion circuit that inverts the data on the data bus based on the error address information.

3. The semiconductor storing apparatus according to claim 2, wherein
the error correction part comprises an address comparison part that compares the error address information with the column address, and corrects the data on the data bus corresponding to an error bit address based on a comparison result.

4. The semiconductor storing apparatus according to claim 1, wherein
the ECC circuit detects an address of a multi-bit error.

5. The semiconductor storing apparatus according to claim 1, wherein
the error correction part is implemented when the page is continuously read.

6. The semiconductor storing apparatus according to claim 5, wherein
the page buffer/sense circuit has a first latch for holding the data in the page read from the memory cell array, and a second latch for receiving the data in the page held by the first latch, each of the first latch and the second latch comprises a first part and a second part capable of performing data transmission independently, the first part and the second part capable of holding ½ page of the data,
when the page is continuously read, while data of the first part of the second latch is output to the outside, error detection and correction is performed on data of the second part of the second latch, while the data of the second part of the second latch is output to the outside, error detection and correction is performed on the data of the first part of the second latch.

7. The semiconductor storing apparatus according to claim 6, wherein
when the page is continuously read, the data is output to the outside in synchronization with a clock signal input from the outside.

8. The semiconductor storing apparatus according to claim 7, wherein the continuous reading of the page satisfies the condition of tPRE+tDIS+tECC<tDOUT (tPRE is a precharge time of bit line, tDIS is a discharge time of a memory cell, tECC is the time for error detection and correction of ½ page, and tDOUT is data output time of one page).

9. The semiconductor storing apparatus according to claim 3, wherein the output circuit supplies n bit data selected from the page buffer/sense circuit to n differential sense amplifiers, and the error correction part inverts the data output from the differential sense amplifier.

10. The semiconductor storing apparatus according to claim 9, wherein the n bit data sensed by the differential sense amplifier are respectively input to one input of n exclusive or gate of the inversion circuit, and the other input of the n exclusive or gate is respectively input with an inversion control signal from the address comparison part.

11. A readout method, which is a readout method for flash memory, and the readout method comprising the following steps:

during a read operation, receiving data held in a page buffer/sense circuit, detecting the data;

holding error address information related to an error address that is detected;

selecting the data from the page buffer/sense circuit based on a column address, and outputting the selected data to a data bus;

correcting the data on the data bus based on the error address information; and outputting the corrected data to the outside.

12. The readout method according to claim 11, wherein the correction step is to compare the error address information with the column address, and invert the data on the data bus corresponding to an error bit address based on a comparison result.

13. The readout method according to claim 11, wherein when a read command is received, it is identified whether the read command is continuous read or page read, if the read command is the continuous read, a controller enables an error correction part through a first enable signal to correct the data output from the page buffer/sense circuit to the data bus.

14. The readout method according to claim 13, wherein if the read command is the page read, the controller disables the error correction part through the first enable signal, and enables a write circuit through a second enable signal, when the error correction part is disabled, all of inversion control signals are set to a first level, so that the data on the data bus pass directly.

* * * * *